(12) United States Patent
Jang et al.

(10) Patent No.: US 7,362,038 B1
(45) Date of Patent: Apr. 22, 2008

(54) SURFACE ACOUSTIC WAVE (SAW) DEVICE PACKAGE AND METHOD FOR PACKAGING A SAW DEVICE

(75) Inventors: Ho Cheol Jang, Seoul (KR); Choon Heung Lee, Kyunggi-do (KR); Seong Min Seo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 365 days.

(21) Appl. No.: 11/108,359

(22) Filed: Apr. 18, 2005

(51) Int. Cl.
*H01L 41/08* (2006.01)
(52) U.S. Cl. ..................................................... 310/344
(58) Field of Classification Search ............ 310/313 R, 310/313 B, 313 D, 340, 344, 348
See application file for complete search history.

(56) References Cited

U.S. PATENT DOCUMENTS

| | | | | |
|---|---|---|---|---|
| 5,459,368 A | * | 10/1995 | Onishi et al. ........... | 310/313 R |
| 5,699,027 A | * | 12/1997 | Tsuji et al. ................. | 333/193 |
| 6,078,123 A | * | 6/2000 | Tanaka et al. .......... | 310/313 R |
| 6,310,421 B2 | * | 10/2001 | Morishima .............. | 310/313 R |
| 6,498,422 B1 | * | 12/2002 | Hori .......................... | 310/344 |
| 7,211,934 B2 | * | 5/2007 | Fujiwara et al. ............ | 310/348 |

* cited by examiner

*Primary Examiner*—Mark Budd
(74) *Attorney, Agent, or Firm*—Weiss & Moy, P.C.

(57) ABSTRACT

A surface acoustic wave (SAW) device package and method for packaging a SAW device provide a surface excited device having a small footprint, low cost and streamlined manufacturing process. A substrate including a SAW active area on a first side is interconnected to external circuits and mechanically mounted via a plurality of metal pillars and an outer metal sealing wall. The sealing wall additionally provides protection from external environmental contamination and interference. The sealing wall may include a number of gaps to reduce stress due to differences in thermal expansion coefficients between the SAW substrate and the metal sealing wall and the gaps may be filled with a flexible sealant. The metal pillars may be round, square or other suitable shape and solder bump terminals may be added to the ends of the pillars and the bottom edge of the sealing wall.

19 Claims, 2 Drawing Sheets

SURFACE ACOUSTIC WAVE (SAW) DEVICE PACKAGE AND METHOD FOR PACKAGING A SAW DEVICE

FIELD OF THE INVENTION

The present invention relates generally to integrated circuit packaging and more specifically, to packaging methods and assemblies for packaging SAW devices.

BACKGROUND OF THE INVENTION

Recent wireless communication appliances including portable telephones and wireless LAN devices are being produced in progressively smaller and thinner packages. Such wireless communication appliances are assembled from numerous components including various SAW filters suitable for performing filtering and resonating functions. The devices mentioned above are required to incorporate an increasing number of functions, and therefore SAW filters are increasingly employed to accomplish this end. In order to manufacture wireless communication appliances and modules in a compact size, packaged SAW filters must be made smaller.

Conventional SAW filters are manufactured according to the following process: a circuit for a SAW filter, typically formed on a piezoelectric substrate, is mounted on an LTCC (Low Temperature Co-fired Ceramic) substrate via a flip-chip or a wire bonding connection process. The exterior of the piezoelectric substrate is then covered with a polymer layer, with the exception of the bottom surface. The outer surface of the polymer is coated with a metal layer to provide shielding, thereby protecting the active region, the input/output bonding pads and the terminals (typically solder bumps that are positioned on the bottom surface of the substrate of the SAW filter), from the external environment. The LTCC substrate of the SAW filter is then mounted on a motherboard and the LTCC substrate having the SAW filter mounted thereon is encapsulated by an encapsulant, along with other electronic devices.

However, the above-described manufacturing process is prolonged and expensive, as the piezoelectric substrate is essentially mounted twice: first on the LTCC substrate, and then the LTCC substrate is mounted on the motherboard. Also, the dual mounting increases the size of the SAW filter, because the size of the LTCC substrate on which the SAW filter is mounted is larger than that of the SAW filter piezoelectric substrate.

Therefore, it would be desirable to provide a SAW device package and method for packaging a SAW device having a reduced cost, simplified manufacturing process and reduced size.

SUMMARY OF THE INVENTION

The above stated objectives are achieved in a SAW device package and a method for packaging a SAW device. The device package includes a piezoelectric substrate including an active SAW region and a number of bonding pads formed on a first surface. A plurality of metal pillars are formed on the bonding pads and a sealing wall is also formed on the first surface, so that the package can be directly mounted to a motherboard without requiring a secondary substrate.

Gaps may be provided in the sealing wall and subsequently closed with a flexible adhesive to prevent differences in the coefficient of thermal expansion (CTE) between the sealing wall and the piezoelectric substrate from causing detachment of the sealing wall or cracking/deformation of the piezoelectric substrate.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
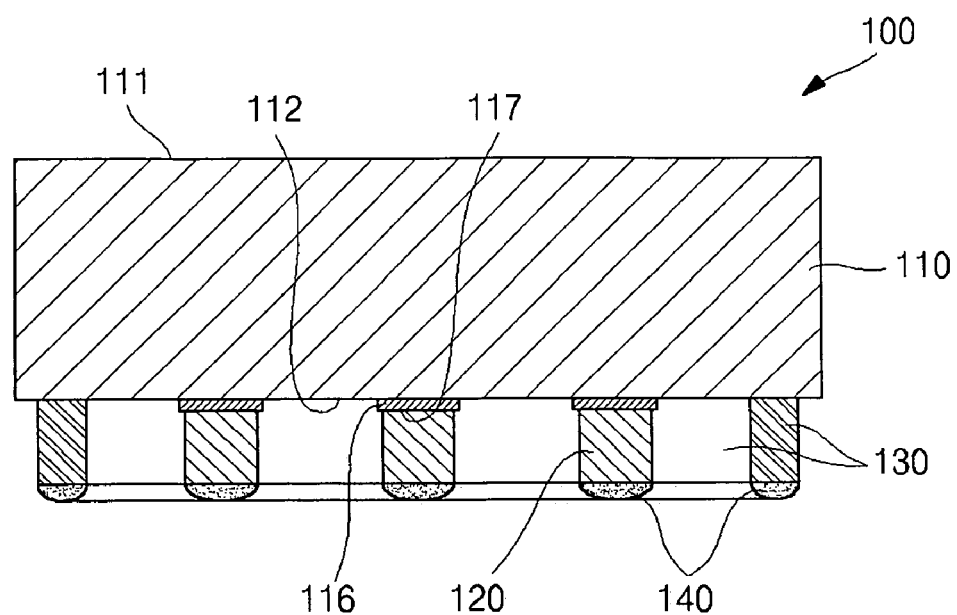
FIG. 1A is a cross-sectional view of a SAW device according to an embodiment of the present invention.
Figure 1B:
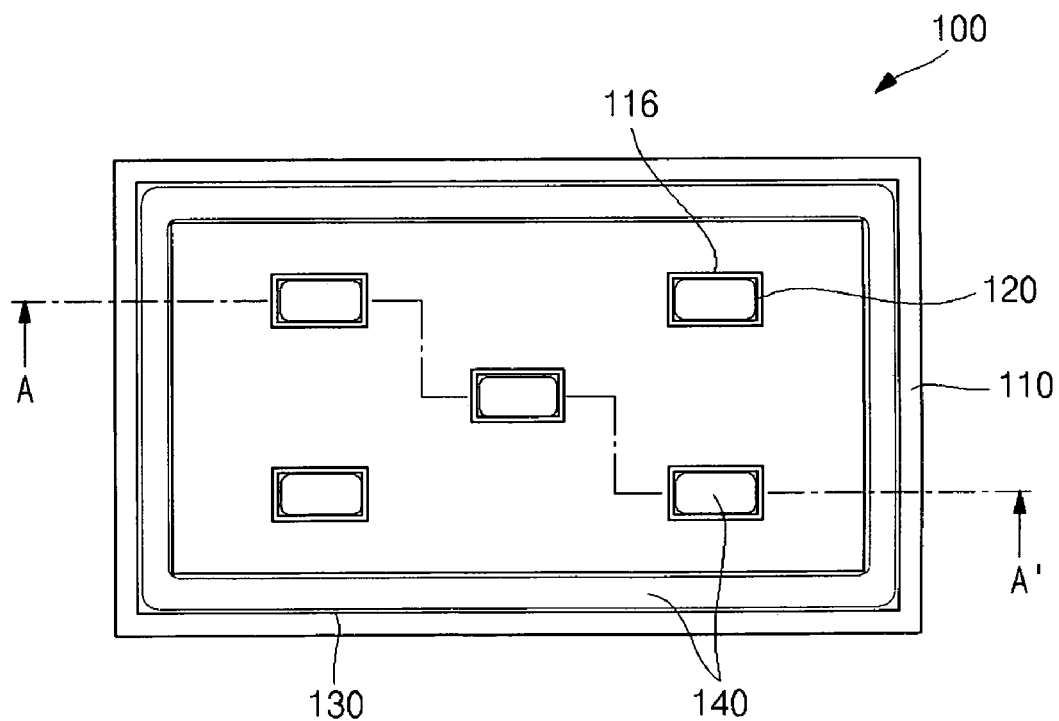
FIG. 1B is a top view of the SAW device of FIG. 1A.

Referring to FIG. 1A and FIG. 1B, a SAW filter 100 according to the present invention is illustrated. As shown, SAW filter 100 includes a piezoelectric substrate 110, a number of metal pillars 120 formed on the bottom surface of piezoelectric substrate 110, and a sealing wall 130 formed on the bottom surface of piezoelectric substrate 110 and extending along each side. A solder cap 140 may be formed on the surface of metal pillars 120 and sealing wall 130. When an electrical signal of a predetermined frequency band is provided to the inputs of SAW filter 100, SAW filter 100 converts the signal into a surface acoustic wave and filters it. After filtering, the surface acoustic wave is converted into an electrical signal having a predetermined frequency band and is provided to an external circuit.

Piezoelectric substrate 110 has a substantially planar first surface 111 and a substantially planar second surface 112 opposing first surface 111. The second surface 112 of piezoelectric substrate 110 has an active region (not shown) formed thereon in a predetermined region, which includes a number of metal patterns (not shown) by which a surface acoustic wave is launched in and received from piezoelectric substrate 110. The SAW active region may include various shapes of metal patterns according to the function and shape of SAW filter 100 and may have metal patterns formed thereon in various three-dimensional shapes according to the desired function. Piezoelectric substrate 110 includes bonding pads 116 that are formed on second surface 112, that are electrically connected to the metal patterns in the SAW active region and which transmit/receive electrical signals to/from external circuits and transmit/receive the signals to the metal patterns.

Bonding pads 116 include: one or more grounding pads, an input pad for receiving an input signal, and an output pad for providing the filtered input signal to an external circuit. The active region is generally formed in a region between the input pad and the output pad of bonding pads 116. An electrical signal coupled through the input pad of piezoelectric substrate 110 is converted into a surface acoustic wave in the active region of piezoelectric substrate 110 and is filtered. After filtering, the surface acoustic wave is again converted into an electrical signal and is transmitted to the output pad.

Metal pillars 120 are formed on bottom surfaces 117 of bonding pads 116, particularly on the input pad, the output pad, and the ground pad, and are generally formed in the shape of circular pillars or square pillars having a predetermined height. Metal pillars 120 are made of a metal having a desired strength and high electrical conductivity, such as Cu metal or Cu alloy. Metal pillars 120 may also be made of silver or aluminum, and the type of metal is not a limitation of the present invention. If the strength of metal pillars 120 is too low, however, the SAW filter may deform when mounted on a substrate and damage the active region of SAW filter 100.

Metal pillars 120 may be formed by a deposition process similar to that used in semiconductor processing, by a plating process similar to that used in a PCB substrate manufacturing process, or formed separately and bonded onto bonding pads 116, but the process for forming metal pillars 120 is also a limitation of the present invention. The height of metal pillars 120 is not specifically limited, as long as an air layer or a vacuum region of predetermined height is formed between the active region of piezoelectric substrate 110 and the substrate to which SAW filter 100 is mounted (refer to FIG. 2), so that the function of the active region is not affected. Solder cap 140 may be formed by coating the bottom surface of the metal pillars 120 for easy attachment of metal pillars 120 to a substrate. Solder cap 140 is generally made from a metal alloy having a low melting point, such as lead/tin alloy solder, but the solder cap 140 material is not a limitation of the present invention.

Metal pillars 120 may alternatively be made as conventional solder bumps. Particularly, SAW filter 100 may have solder bumps formed on bottom surface 117 of bonding pads 116 and SAW filter 100 can be mounted on a substrate by the solder bumps. The solder bumps are made up of metal having a low melting point, such as tin alloy. When metal pillars 120 are solder bumps, no solder cap 140 is separately formed on the bottom surfaces of metal pillars. In the above-described solder ball arrangement, sealing wall 130 supports SAW filter 100 and prevents the solder bumps from deforming when attached to a substrate, as will be described below.

Sealing wall 130 is spaced inward a predetermined distance from each side of second surface 112 of piezoelectric substrate 110 and is extends along each side with a predetermined width and height. Accordingly, the active region of piezoelectric substrate 110 and bonding pads 116 are positioned inside sealing wall 130. Sealing wall 130 is made of a metallic, ceramic, or plastic material having a predetermined strength and heat resistance, such as aluminum and silver, but the material is not a limitation of the present invention. Preferably, the sealing wall 130 is simultaneously formed by the same process and with the same material as form metal pillars 120. Particularly, sealing wall 130 may be made up of Cu metal or Cu alloy. If the material constituting sealing wall 130 has a low strength or poor heat resistance, SAW filter 100 may be damaged when it is encapsulated after being mounted on a substrate and encapsulant may flow onto the second surface 112 of the piezoelectric substrate 110, disturbing the function of SAW filter 100 by contacting the active region.

The sealing wall 130 may be formed by a deposition process as is used in semiconductor processing or by a plating process such as that used in PCB substrate manufacturing processes, as in the case of the metal pillars 120, but the material is not a limitation of the present invention. Sealing wall 130 generally has the same height as metal pillars 120. Sealing wall 130 has a solder cap 140 formed on the bottom surface thereof, as in the case of the metal pillar 120. Solder cap 140 enables the metal pillars 120 to be easily attached to a substrate. As mentioned above, solder cap 140 may be made up of metal having a low melting point, such as lead and tin alloy, but the material is not a limitation of the present invention. An alternative "Solder cap" 140 may be formed by applying an adhesive in embodiments where sealing wall 130 is made of thermosetting plastic or the like.

Figure 2:
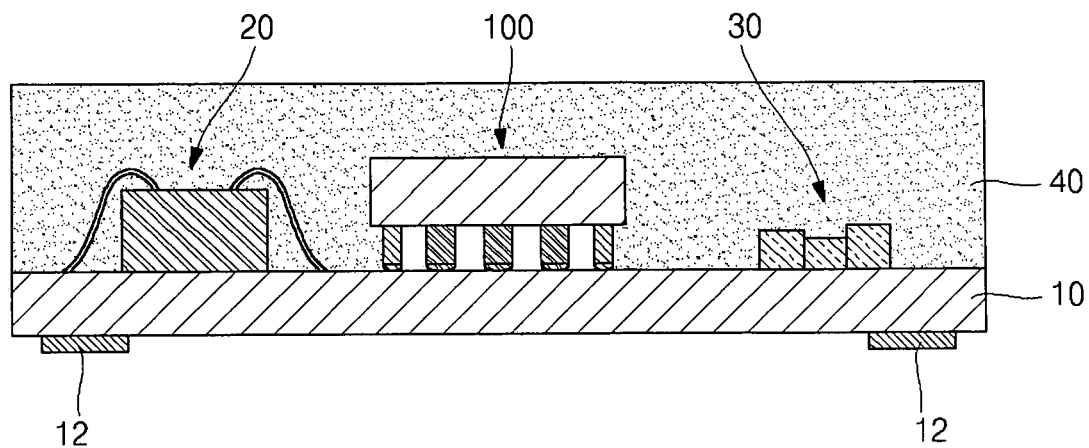
FIG. 2 is a cross-sectional view of a circuit module including a SAW device according to an embodiment of the present invention.

Referring now to FIG. 2, a sectional view of a module in which SAW filter 100 of FIG. 1A is incorporated is depicted. As shown, the module is formed by mounting various integrated circuits (ICs), including a semiconductor die 20, SAW filter 100, and a passive device 30 on the upper surface of a low-temperature co-fired ceramic (LTCC) substrate 10. Substrate 10 has a number of conductive patterns (not shown) formed on the upper surface thereof and is electrically connected to terminals of semiconductor die 20, SAW filter 100, and passive device 30. The ICs may be electrically connected to substrate 10 by a wire bonding method or a flip-chip bonding method, but other bonding methods may also be used. The module may also include other devices required to support the desired functionality of the module. Substrate 10 has lead grid array (LGA) or ball grid array (BGA) lands 12 formed on the lower surface thereof, which are electrically connected to the conductive patterns on the upper surface, for electrically and mechanically connecting the module to a separate substrate or motherboard. The top of substrate 10, semiconductor die 20, SAW filter 100, and passive device 30 are all encapsulated by an encapsulant 40 after the devices are mounted. Encapsulant 40 protects the devices from external environments and assists in mechanically retaining devices on substrate 10. When the upper surface of substrate 10 is encapsulated, encapsulant 40 does not flow onto the bottom surface of SAW filter 100. In particular, encapsulant 40 does not contact second surface 112 of piezoelectric substrate 110. Specifically, SAW filter 100 is attached to substrate 10 by sealing wall 130 and pillars 120 and sealing wall 130 prevents encapsulant 40 from flowing into the interior of sealing wall 130. Therefore, encapsulant 40 does not flow into the area of bonding pads 116, metal pillars 120 and the active region formed on bottom surface 112 of SAW filter 100.

As mentioned above, SAW filter 100 can be directly mounted on substrate 10 of the module and need not be mounted on a separate LTCC substrate beforehand. Therefore, SAW filter 100 has a reduced size, an increased mounting density, and a reduced number of processes is therefore required for manufacturing the modules. When bonding pad 116 of SAW filter 100 is mounted on the substrate 10 by solder bumps instead of metal pillars, sealing wall 130 supports the solder bumps and prevents them from deforming due to external force or impact. SAW filter 100 has reduced material cost, because no material is used for a separate LTCC substrate. When sealing wall 130 is made from the same material as metal pillars 120, sealing wall 130 can be fabricated with existing manufacturing equipment, e.g. plating or metal deposition equipment, without requiring any additional equipment or manufacturing steps.

Figure 3:
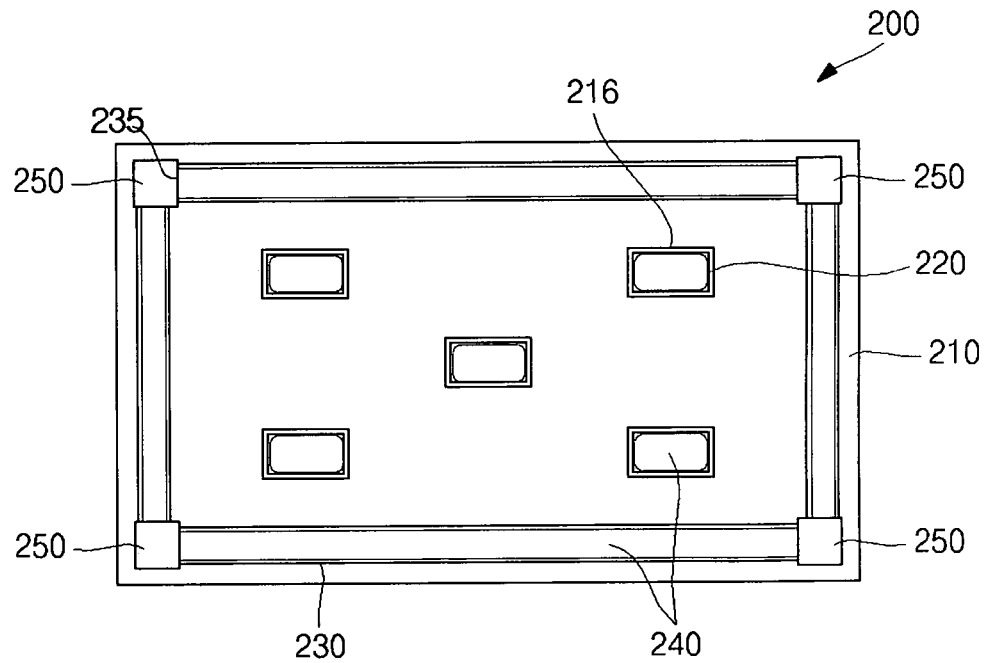
FIG. 3 is a bottom view of a SAW device in accordance with another embodiment of the present invention.

Referring to FIG. 3, a SAW filter 200 according to another embodiment of the present invention is shown. SAW filter 200 includes a piezoelectric substrate 210, a number of bonding pads 216, a number of metal pillars 220, a sealing wall 230, and a number of gap fillers 250. Metal pillars 220 and sealing wall 230 may have solder caps 240 formed on the bottom surface thereof. Piezoelectric substrate 210 and bonding pads 216 have the same configuration as described above with respect to SAW filter 100 as shown in FIG. 1 and therefore will not be described again below.

Sealing wall 230 is spaced inward a predetermined distance from each side of the second surface of piezoelectric substrate 210 and is formed along the sides of piezoelectric substrate 210 with predetermined width and height. Sealing wall 230 is not continuously formed around the SAW device 200 package, but in the present embodiment, sealing wall 230 defines gaps 235 that are formed at predetermined positions. In particular, sealing wall 230 is not formed as an integral whole but is discontinuous due to gaps 235. Gaps 235 are generally formed in regions corresponding to corners of sealing wall 230, that is, at junctions of sides of piezoelectric substrate 210. However, gaps 235 may alternatively or additionally be formed in sealing wall 230 at predetermined positions between the corners of sealing wall. If sealing wall 230 were made continuous along the sides of the second surface of the piezoelectric substrate 210, sealing wall 230 would expand and generate local stresses as heating or other temperature changes occur during the manufacturing process and during operation of the module. When sealing wall 230 expands, thermal mismatch with the piezoelectric substrate 210 or with substrate 10 causes local stress concentration, which may generate a crack or distort piezoelectric substrate 210, affecting the shape and piezoelectric behavior of the active area and thus alter the operation of the filter. Therefore, sealing wall 230 preferably has gaps 235 formed at predetermined positions to alleviate stresses caused by differences in coefficient of thermal expansion (CTE) between sealing wall 230 and piezoelectric substrate 210 and also any external mounting substrate.

Preferably, sealing wall 230 is simultaneously formed in the same process and of the same material as metal pillars 220, as mentioned above with respect to SAW filter 100 of FIG. 1. Particularly, sealing wall 230 may be copper. Sealing wall 230 and metal pillars 220 have solder caps 240 formed on their bottom surfaces. Solder cap 240 provides for attachment of metal pillars 220 and sealing wall 230 to the conductive pattern on substrate 10.

A gap filler 250 is introduced in gaps 235 to close sealing wall 230. Gap filler 250 may be a silicone rubber having high elasticity and heat resistance, but alternatively may be another elastic substance having high elasticity and heat resistance, such as a rubber material including acrylate rubber and fluoro rubber, but the material of gap filler 250 is not a limitation of the present invention. Gap filler 250 seals gaps 235 formed in sealing wall 230 and prevents the encapsulant from flowing inside sealing wall 230 during the encapsulation process. When the sealing wall 230 expands, the gap filler 250 is compressed and absorbs the volume change caused by the expansion of sealing wall 230 to avoid local stress concentration on sealing wall 230 and piezoelectric substrate 210.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A surface acoustic wave (SAW) device, comprising:
a piezoelectric substrate having a substantially planar first surface and a substantially planar second surface opposing the first surface, wherein the second surface includes an active SAW region and a number of bonding pads formed thereon;
a plurality of metal pillars extending from the bonding pads and perpendicular to the second surface for electrically connecting the SAW device to an external circuit; and
a sealing wall attached to and extending perpendicularly from the second surface near the periphery of the piezoelectric substrate, wherein the sealing wall extends intermittently along the periphery of the piezoelectric substrate and defines gaps between intermittent portions of the sealing wall.

2. The SAW device of claim 1, wherein the bonding pads include a SAW device input pad, a SAW device output pad and a ground pad, and wherein the active SAW region includes a number of metal patterns for converting an input signal provided at the SAW device input pad into a surface acoustic wave and receiving the surface acoustic wave to provide an output signal at the SAW device output pad.

3. The SAW device of claim 1, wherein the sealing wall extends continuously along the periphery of the piezoelectric substrate.

4. The SAW device of claim 1, wherein the gaps are located at intersections of intermittent portions of the sealing wall that are perpendicular to each other and defining corners of the sealing wall.

5. The SAW device of claim 1, wherein the gaps are located between intermittent portions of the sealing wall that extend co-linearly in a direction parallel to the second surface.

6. The SAW device of claim 1, further comprising gap fillers located in the gaps defined by said sealing wall.

7. The SAW device of claim 6, wherein the gap fillers are made from an elastic material.

8. The SAW device of claim 7, wherein the gap fillers are made from silicone rubber.

9. The SAW device of claim 1, wherein the metal pillars are plated pillars.

10. The SAW device of claim 1, wherein the metal pillars are vapor-deposited on the bonding pads.

11. The SAW device of claim 1, wherein the metal pillars are formed separately and bonded to the bonding pads.

12. The SAW device of claim 11, wherein the metal pillars comprise solder balls that are attached to the bonding pads.

13. The SAW device of claim 1, further comprising solder caps formed on the pillars and the sealing wall at the extreme extension of pillars and the sealing wall from the second surface.

14. The SAW device of claim 1, further comprising an encapsulant covering the first side of the piezoelectric substrate and outside surfaces of the sealing wall along the edges of the piezoelectric substrate, and wherein the sealing wall retains the encapsulant so that the encapsulant does not contact the active SAW region of the piezoelectric substrate.

15. A surface acoustic wave (SAW) device, comprising:
a piezoelectric substrate having a substantially planar first surface and a substantially planar second surface opposing the first surface, wherein the second surface includes an active SAW region and a number of bonding pads formed thereon;
a plurality of metal pillars extending from the bonding pads and perpendicular to the second surface for electrically connecting the SAW device to an external circuit;
an encapsulant covering the first surface and edges of the piezoelectric substrate; and
means for sealing the active SAW region from the encapsulant, whereby the encapsulant does not contact the active SAW region, wherein the means for sealing extends intermittently along the periphery of the piezoelectric substrate and defines gaps between intermittent portions of the sealing wall.

16. The SAW device of claim 15, further comprising:
means for reducing stress between the sealing wall and the piezoelectric substrate when the SAW device is exposed to thermal changes; and
means for preventing said stress-reducing means from admitting the encapsulant.

17. A surface acoustic wave (SAW) device, comprising:
a piezoelectric substrate having a first surface and a second surface opposing the first surface, wherein the second surface includes a plurality of bonding pads formed thereon;
a plurality of metal pillars extending from the bonding pads and approximately perpendicular to the second surface for electrically connecting the SAW device to an external circuit; and
a sealing wall attached to and extending perpendicularly from the second surface near the periphery of the piezoelectric substrate, wherein the sealing wall extends intermittently along the periphery of the piezoelectric substrate and defines gaps between intermittent portions of the sealing wall.

18. The SAW device of claim 17, wherein the bonding pads include a SAW device input pad, a SAW device output pad and a ground pad, and wherein an input signal provided at the SAW device input pad is converted into a surface acoustic wave and then to an electrical signal provide at the SAW device output pad.

19. The SAW device of claim 17, further comprising solder caps formed on a bottom surface of the plurality of metal pillars.

\* \* \* \* \*